US008664692B2

(12) United States Patent
Ogura et al.

(10) Patent No.: US 8,664,692 B2
(45) Date of Patent: Mar. 4, 2014

(54) SEMICONDUCTOR DEVICE

(75) Inventors: Tsuneo Ogura, Kanagawa-ken (JP); Tomoko Matsudai, Tokyo (JP); Yuichi Oshino, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,097

(22) Filed: Aug. 30, 2012

(65) Prior Publication Data
US 2013/0221401 A1 Aug. 29, 2013

(30) Foreign Application Priority Data

Feb. 28, 2012 (JP) .................................. 2012-041994

(51) Int. Cl.
*H01L 29/739* (2006.01)
*H01L 29/73* (2006.01)

(52) U.S. Cl.
USPC ................... 257/139; 257/587; 257/E29.197; 257/E29.174

(58) Field of Classification Search
None
See application file for complete search history.

(56) References Cited

U.S. PATENT DOCUMENTS

| 5,811,873 | A | 9/1998 | Soejima | |
|---|---|---|---|---|
| 6,388,306 | B1 | 5/2002 | Hirano et al. | |
| 7,187,041 | B2* | 3/2007 | Mizokuchi et al. | 257/401 |
| 7,491,982 | B2* | 2/2009 | Takahashi | 257/170 |
| 7,952,143 | B2* | 5/2011 | Soeno et al. | 257/341 |
| 8,248,116 | B2* | 8/2012 | Soeno et al. | 327/108 |
| 2008/0102576 | A1 | 5/2008 | Suzuki et al. | |
| 2010/0006861 | A1* | 1/2010 | Yamamoto et al. | 257/77 |
| 2010/0155830 | A1* | 6/2010 | Takahashi | 257/328 |
| 2011/0193132 | A1* | 8/2011 | Kouno et al. | 257/139 |
| 2012/0074459 | A1 | 3/2012 | Ogura | |

FOREIGN PATENT DOCUMENTS

| JP | 06-314801 | 11/1994 |
|---|---|---|
| JP | 8316500 | 11/1996 |
| JP | 2000-228404 | 8/2000 |
| JP | 2001-210651 | 8/2001 |
| JP | 2004-088012 | 3/2004 |
| JP | 2008-109028 | 5/2008 |
| JP | 2008205500 A | 9/2008 |
| JP | 2008-251679 | 10/2008 |
| JP | 2008-283112 | 11/2008 |
| JP | 2009-141202 | 6/2009 |
| JP | 2011-086891 | 4/2011 |
| KR | 1020070000437 | 1/2007 |

OTHER PUBLICATIONS

Korean Office Action dated Aug. 28, 2013, filed in Korean counterpart Application No. 10-2012-095444, 10 pages (with translation).

* cited by examiner

*Primary Examiner* — Thomas L Dickey
*Assistant Examiner* — Joseph Schoenholtz
(74) *Attorney, Agent, or Firm* — Patterson & Sheridan, LLP

(57) ABSTRACT

According to one embodiment, a semiconductor device includes a first electrode, a first conductivity type cathode layer, a first conductivity type base layer, a second conductivity type anode layer, a second conductivity type semiconductor layer, a first conductivity type semiconductor layer, an buried body, and a second electrode. The first conductivity type semiconductor layer is contiguous to the second conductivity type semiconductor layer in a first direction, and extends on a surface of the anode layer in a second direction that intersects perpendicularly to the first direction. The buried body includes a bottom portion and a sidewall portion. The bottom portion is in contact with the base layer. The sidewall portion is in contact with the base layer, the anode layer, the second conductivity type semiconductor layer and the first conductivity type semiconductor layer. The buried body extends in the first direction.

17 Claims, 11 Drawing Sheets

SEMICONDUCTOR DEVICE

CROSS-REFERENCE TO RELATED APPLICATION

This application is based upon and claims the benefit of priority from Japanese Patent Application No. 2012-041994, filed on Feb. 28, 2012; the entire contents of which are incorporated herein by reference.

FIELD

Embodiments described herein relate generally to a semiconductor device.

BACKGROUND

In the recent years, an Insulated Gate Bipolar Transistor (IGBT) and a diode are widely used as power semiconductor devices for a power converting device such as an inverter. The diode is typically used to freewheel current from a load. To improve a property of the power converting device such as the inverter, a property improvement in the diode is required along with a property improvement in the IGBT. As the property of the diode, an ON voltage (voltage drop in a conducted state), a switching speed (extinction time of a recovery current upon turnoff), a reverse-biased safety operation region upon the turnoff (region that would not break down even when a voltage is applied under a state in which the recovery current is flowing), and a current vibration upon the turnoff (voltage vibration) may be exemplified.

DETAILED DESCRIPTION

According to one embodiment, a semiconductor device includes a first electrode, a first conductivity type cathode layer provided on the first electrode, a first conductivity type base layer provided on the cathode layer, a second conductivity type anode layer provided on the base layer, a second conductivity type semiconductor layer provided on the anode layer, a first conductivity type semiconductor layer provided on the anode layer, an buried body, and a second electrode provided on the first conductivity type semiconductor layer and the second conductivity type semiconductor layer. The first conductivity type semiconductor layer is contiguous to the second conductivity type semiconductor layer in a first direction, and extends on a surface of the anode layer in a second direction that intersects perpendicularly to the first direction. The buried body includes a bottom portion and a sidewall portion. The bottom portion is in contact with the base layer. The sidewall portion is in contact with the base layer, the anode layer, the second conductivity type semiconductor layer and the first conductivity type semiconductor layer. The buried body extends in the first direction.

Hereinafter, embodiments will be described with reference to the drawings. Note that, in the respective drawings, the same reference is given to the same component. In the embodiments below, although an explanation will be given by assuming that a first conductivity type is an n type and a second conductivity type is a p type, the first conductivity type may be the p type, and the second conductivity type may be the n type.

In the embodiments below, the explanation will be given by taking a vertical p-intrinsic-n (pin) diode in which a current flows in a vertical direction along which a first electrode 21 provided on one main surface side in a thickness direction in a semiconductor layer and a second electrode 22 provided on the other main surface side are connected as an example of a semiconductor device.

Further, the semiconductor device of the embodiments uses for example silicon as a semiconductor material. Alternatively, a semiconductor other than silicon (for example, a compound semiconductor such as SiC, GaN and the like) may be used.

(First Embodiment)

Figure 1:
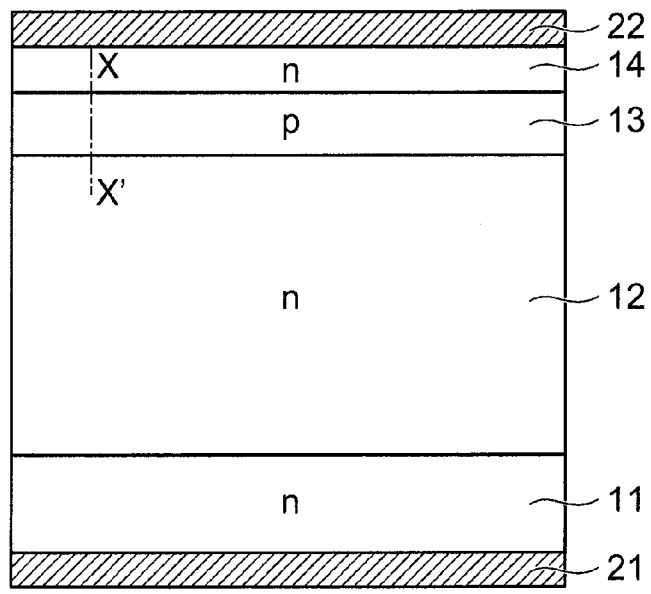
FIG. 1 is a schematic cross sectional view of a semiconductor device of a first embodiment.

FIG. 1 is a schematic cross sectional view of a semiconductor device of the first embodiment.

In the embodiment, a first electrode 21 functions as a cathode electrode, and a second electrode 22 functions as an anode electrode. A semiconductor layer provided between the first electrode 21 and the second electrode 22 includes an n-type cathode layer 11, an n-type base layer 12, a p-type anode layer 13, and an n-type semiconductor layer 14.

The n-type cathode layer 11 is provided on the first electrode 21. The n-type cathode layer 11 is electrically connected with the first electrode 21 by making an ohmic contact.

The n-type base layer 12 is provided on the n-type cathode layer 11. The p-type anode layer 13 is provided on the n-type base layer 12. The n-type semiconductor layer 14 is provided on the p-type anode layer 13.

The second electrode 22 is provided on the n-type semiconductor layer 14. The n-type semiconductor layer 14 makes an ohmic contact with the second electrode 22. In the example shown in FIG. 1, the n-type semiconductor layer 14 is provided on an entire surface of the p-type anode layer 13. Accordingly, the p-type anode layer 13 is not in contact with the second electrode 22.

Figure 2:
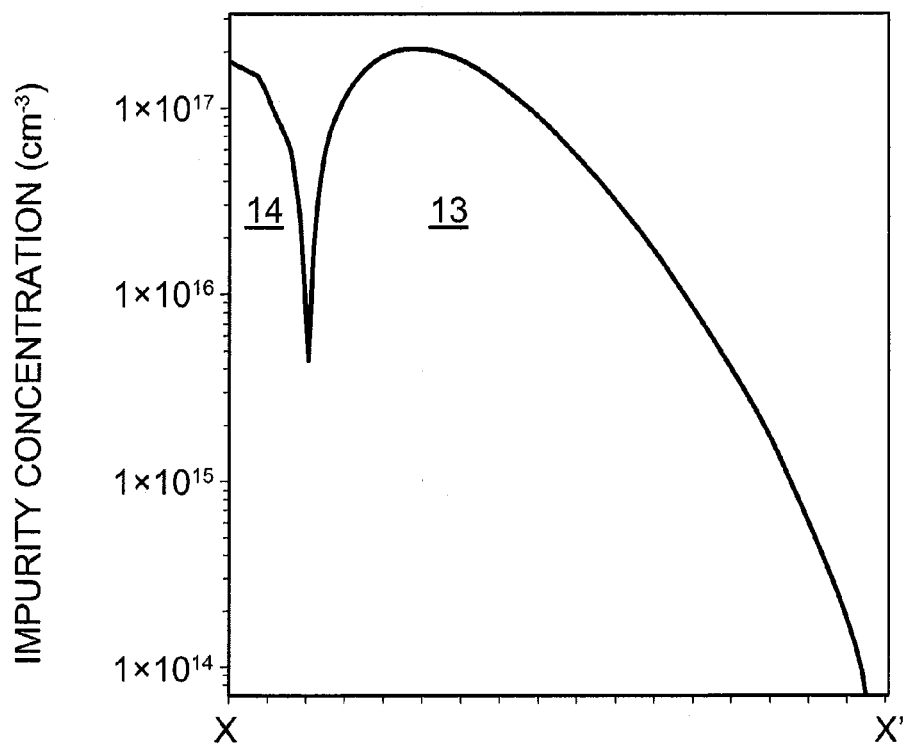
FIG. 2 is a distribution chart of an impurity concentration in an x-x' direction in FIG. 1.

FIG. 2 shows a distribution of an impurity concentration ($cm^{-3}$) in an x-x' direction in FIG. 1. A p-type impurity concentration is shown for the p-type anode layer 13, and an n-type impurity concentration is shown for the n-type semiconductor layer 14.

The n-type impurity concentration of the n-type semiconductor layer 14 becomes maximum in the vicinity of an interface between the n-type semiconductor layer 14 and the second electrode 22. The n-type impurity concentration of the n-type semiconductor layer 14 gradually decreases from the interface between the n-type semiconductor layer 14 and the second electrode 22 toward a p-type anode layer 13 side, and becomes minimum in the vicinity of an interface between the n-type semiconductor layer 14 and the p-type anode layer 13.

The p-type impurity concentration of the p-type anode layer 13 gradually rises from the interface between the p-type anode layer 13 and the n-type semiconductor layer 14 toward an n-type base layer 12 side and exhibits its peak value, and gradually decreases from a position exhibiting the peak value toward the n-type base layer 12 side. Note that, the position exhibiting the peak value of the p-type impurity concentration of the p-type anode layer 13 may be located on the n-type base layer 12 side than the n-type semiconductor layer 14.

In the example shown in FIG. 2, a peak value of the n-type impurity concentration of the n-type semiconductor layer 14 and the peak value of the p-type impurity concentration of the p-type anode layer 13 are substantially the same.

Figure 13:
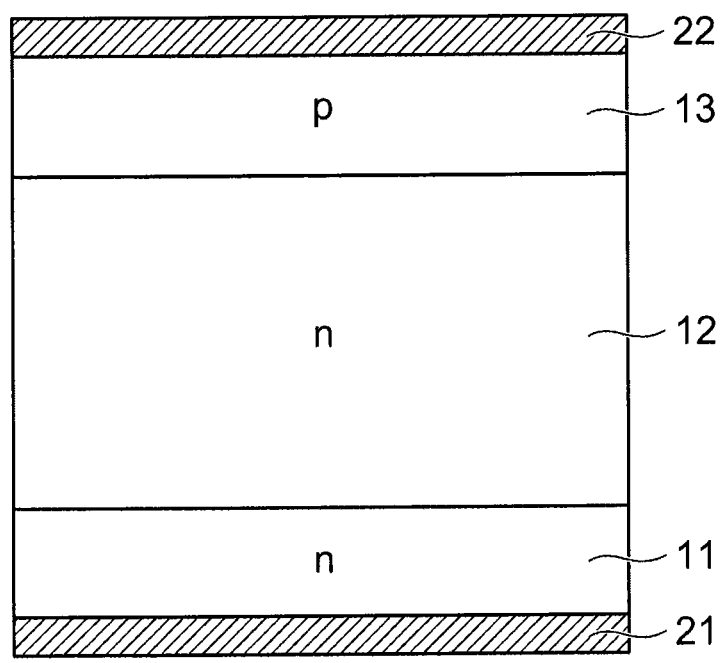
FIG. 13 is a schematic cross sectional view of a semiconductor device of a comparative example.

Here, FIG. 13 is a schematic cross sectional view of a semiconductor device of a comparative example.

The semiconductor device of the comparative example differs from the first embodiment in that an n-type semiconductor layer is not provided between a p-type anode layer 13 and a second electrode 22.

In order to suppress injection of holes to an n-type base layer 12 in a conducted state and increase switching speed, an impurity concentration (net concentration) of the p-type anode layer 13 is for example desirably set to $1 \times 10^{13}$ (cm$^{-2}$) or less. However, when the impurity concentration of the p-type anode layer 13 is made too low, discharge of carriers upon the turnoff becomes fast due to the carriers in the conducted state being decreased, so there is a concern of a problem that a current vibration becomes large.

Figure 3:
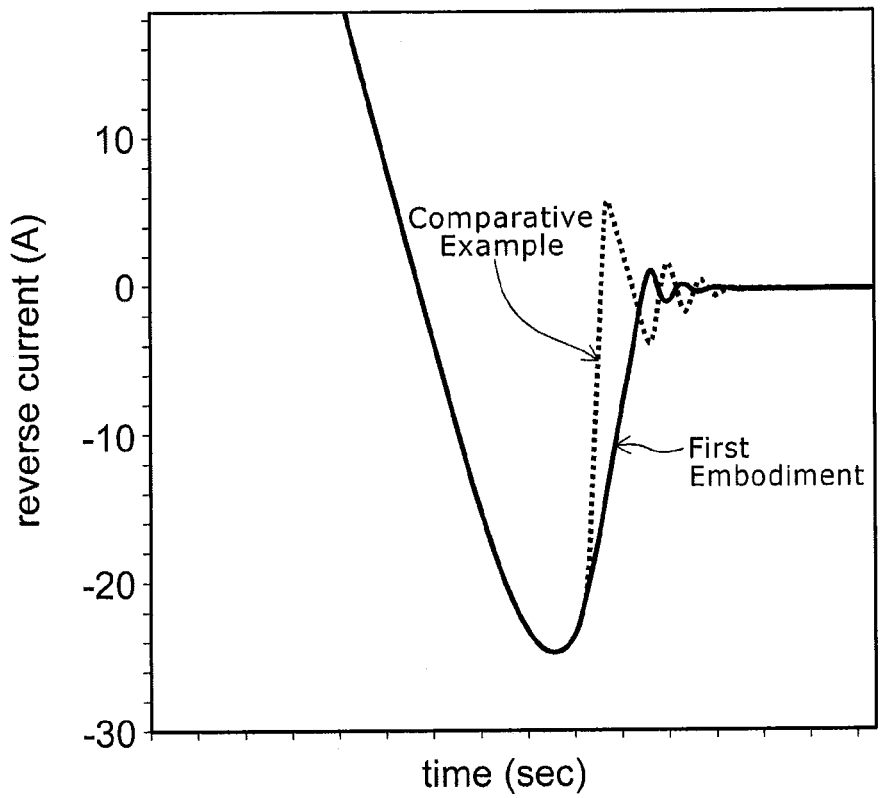
FIG. 3 is a switching wave form chart of the first embodiment and a comparative example.

Here, FIG. 3 is a simulated switching wave form chart of the first embodiment and the comparative example. A horizontal axis indicates time, and a vertical axis indicates a reverse current (A).

In the first embodiment and the comparative example, a total electric charge and the impurity concentration of the p-type anode layer 13 are assumed to be the same, and thus the ON voltage is also the same.

In the first embodiment, a current decrease after the peak value of the reverse current is moderate compared to the comparative example, and it can be understood that the current vibration is small.

In the first embodiment, the n-type semiconductor layer 14 is provided between the p-type anode layer 13 and the second electrode 22, and further, the peak value of the n-type impurity concentration of the n-type semiconductor layer 14 is made to be at a relatively low concentration that is substantially at the same degree as the peak value of the p-type impurity concentration of the p-type anode layer 13.

Due to this, the n-type semiconductor layer 14 functions as a barrier to the holes upon the turnoff, whereby the discharge of the holes to the second electrode 22 can be suppressed, and a soft recovery (suppression of the voltage vibration) can be realized.

Further, by suppressing the peak value of the n-type impurity concentration of the n-type semiconductor layer 14 to be at substantially the same degree as the peak value of the p-type impurity concentration of the p-type anode layer 13, an operation of a parasitic npn transistor including the n-type semiconductor layer 14, the p-type anode layer 13, and the n-type cathode layer 11 can be suppressed. Due to this, decrease in a breakdown voltage can be suppressed.

Note that, aside from making the peak value of the n-type impurity concentration of the n-type semiconductor layer 14 to be at substantially the same degree as the peak value of the p-type impurity concentration of the p-type anode layer 13, it has been confirmed by simulation that the soft recovery and the operation of the parasitic npn transistor can be suppressed compared to the comparative example so long as the peak value of the n-type impurity concentration of the n-type semiconductor layer 14 is at or less than 10 times the peak value of the p-type impurity concentration of the p-type anode layer 13.

Figure 4:
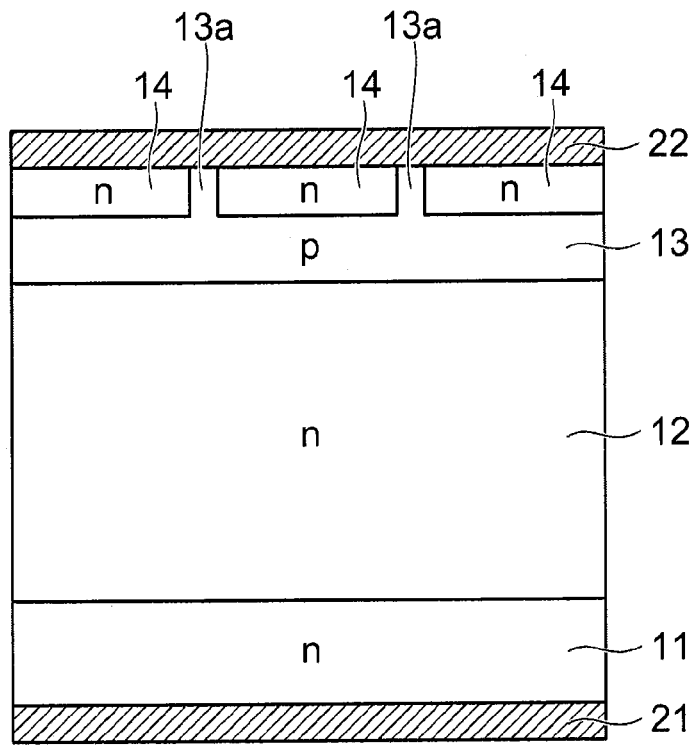
FIG. 4 is a schematic cross sectional view of a variation of the semiconductor device of the first embodiment.

FIG. 4 is a schematic cross sectional view of a variation of the semiconductor device of the first embodiment.

In a structure of FIG. 4, an n-type semiconductor layer 14 is not provided on an entire surface of a p-type anode layer 13, but is divided in a planar direction. At portions where the n-type semiconductor layer 14 is divided, p-type semiconductor layers 13a are provided. The p-type semiconductor layers 13a have a higher p-type impurity concentration than the p-type anode layer 13, and make ohmic contacts with a second electrode 22.

Figure 5A:
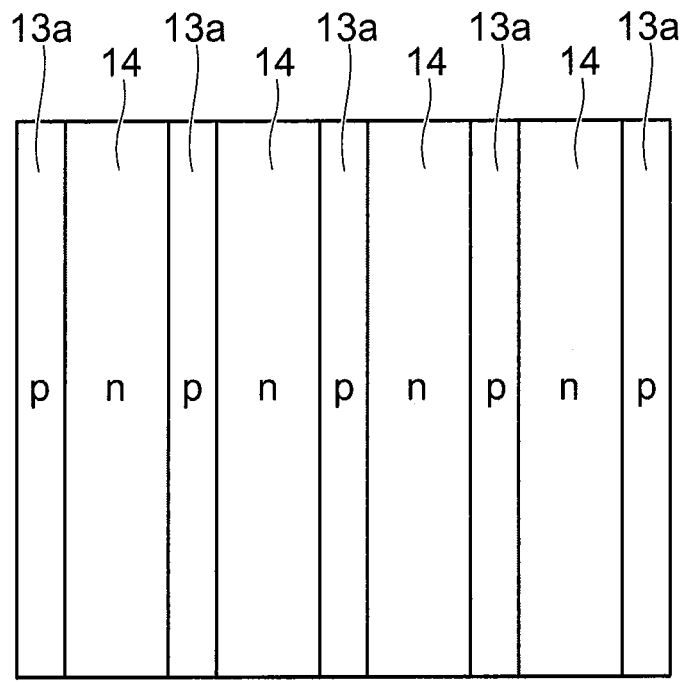
FIGS. 5A and 5B are schematic plan view of a variation of the semiconductor device of the first embodiment.
Figure 5B:
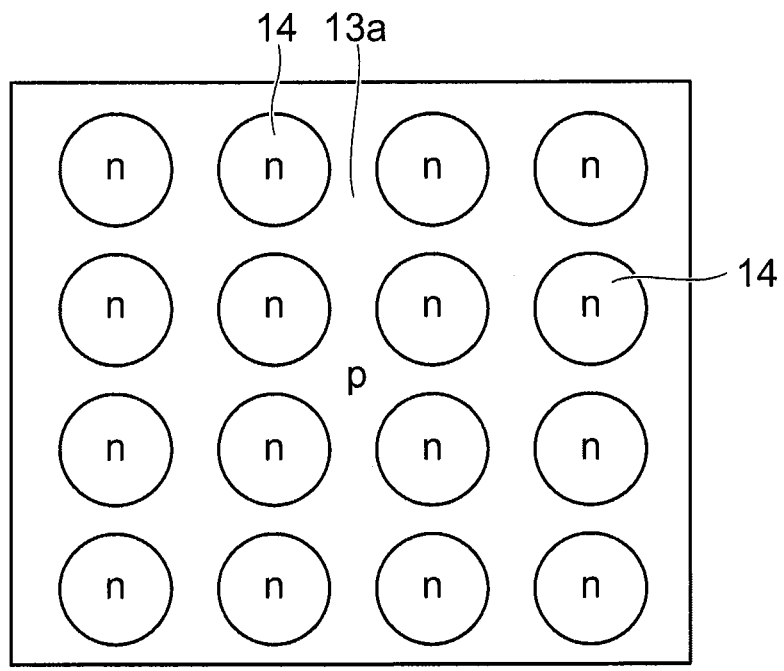

As shown in FIG. 5A, the n-type semiconductor layer 14 may be formed in a striped planar pattern for example. Alternatively, as shown in FIG. 5B, the n-type semiconductor layer 14 may be formed in a circular island-shaped planar pattern for example.

(Second Embodiment)

Figure 6:
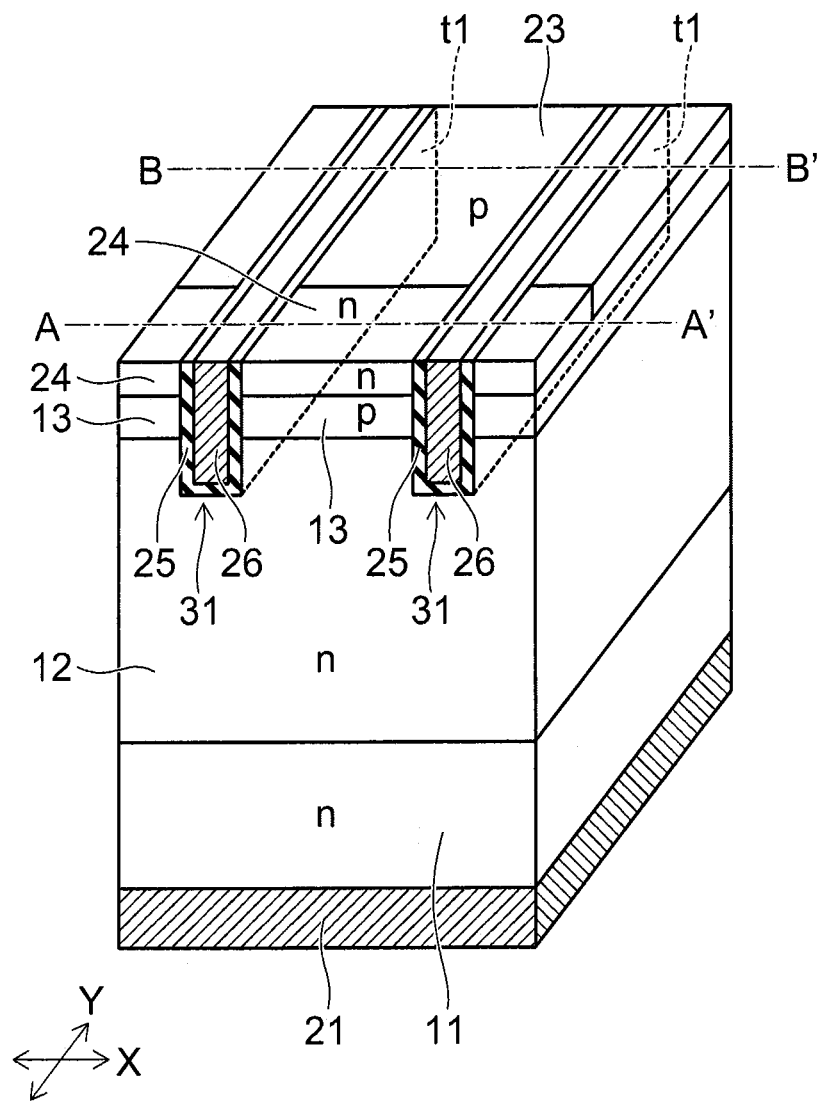
FIG. 6 is a schematic perspective view of a semiconductor device of a second embodiment.

FIG. 6 is a schematic perspective view of a semiconductor device of a second embodiment.

Figure 7A:
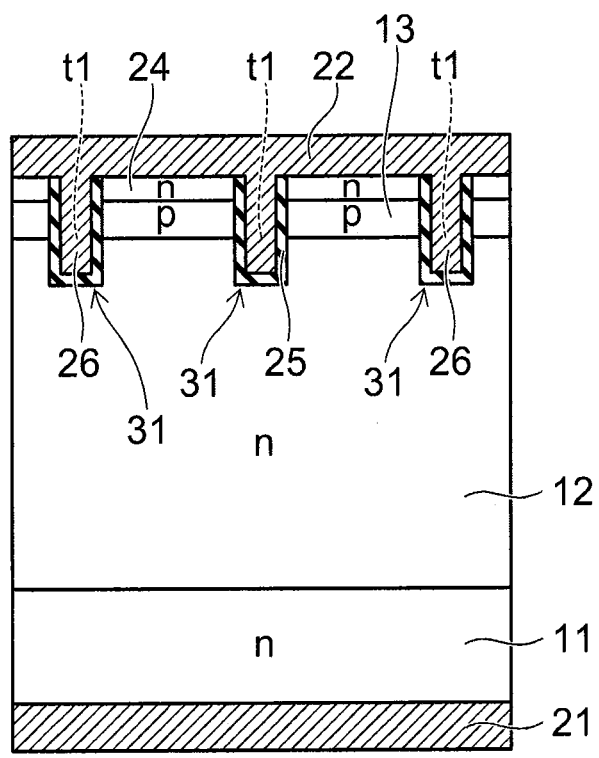
FIG. 7A is a cross sectional view along A-A' in FIG. 6.
Figure 7B:
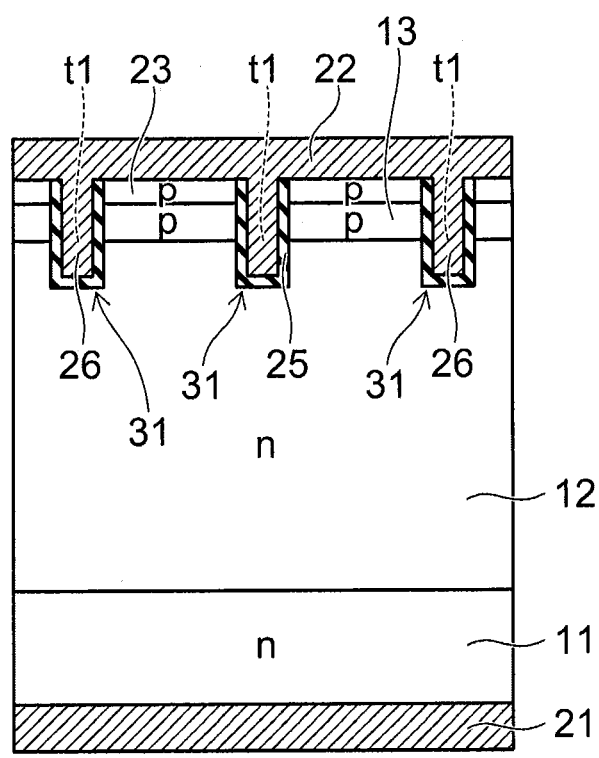
FIG. 7B is a cross sectional view along B-B' in FIG. 6.

FIG. 7A is a cross sectional view along A-A' in FIG. 6, and FIG. 7B is a cross sectional view along B-B' in FIG. 6. Note that, in FIG. 6, illustration of a second electrode 22 shown in FIGS. 7A and 7B is omitted.

The semiconductor device of the second embodiment also is a vertical pin diode in which a current flows in a vertical direction along which a first electrode 21 and the second electrode 22 are connected.

A semiconductor layer provided between the first electrode 21 that functions as a cathode electrode and the second electrode 22 that functions as an anode electrode includes an n-type cathode layer 11, an n-type base layer 12, a p-type anode layer 13, an n-type semiconductor layer 24, and a p-type semiconductor layer 23.

The n-type cathode layer 11 is provided on the first electrode 21. The n-type cathode layer 11 is electrically connected with the first electrode 21 by making an ohmic contact.

The n-type base layer 12 is provided on the n-type cathode layer 11. The p-type anode layer 13 is provided on the n-type base layer 12. The n-type semiconductor layer 24 and the p-type semiconductor layer 23 are provided on the p-type anode layer 13.

Here, in a plane parallel to a surface of the p-type anode layer 13, a first direction Y and a second direction X that intersect one another perpendicularly are defined. The n-type semiconductor layer 24 and the p-type semiconductor layer 23 are aligned contiguous to one another along the first direction Y on a surface of the p-type anode layer 13.

The n-type semiconductor layer 24 extends in the second direction X.

On a surface side of the semiconductor layer onto which the n-type semiconductor layer 24 and the p-type semiconductor layer 23 are provided, a plurality of buried bodies 31, each having a trench structure, is formed. The buried bodies 31 are formed to align along the second direction X for example in a striped planar pattern. The buried bodies 31 each includes a bottom portion making contact with the n-type base layer 12, and a sidewall portion making contact with the n-type base layer 12, the p-type anode layer 13, the n-type semiconductor layer 24 and the p-type semiconductor layer 23, and extends in the first direction Y.

The buried bodies 31 are provided in trenches t1. The trenches t1 penetrate the p-type anode layer 13 from a surface of the n-type semiconductor layer 24 and a surface of the p-type semiconductor layer 23, and reach the n-type base layer 12. Further, the trenches t1 extend in the first direction Y.

An insulating film 25 is provided at the bottom portion (bottom wall of the trench t1) and the sidewall portion (side wall of the trench t1) of each of the buried bodies 31. A third electrode (buried electrode) 26 is provided inside each of the insulating films 25.

As shown in FIGS. 7A and 7B, for example, parts of the second electrode 22 are buried in the trenches t1 as the third electrodes 26. The second electrode 22 and the third electrodes 26 are formed integrally by the same material. The third electrodes 26 are electrically connected with the second electrode 22. Note that, the function of the third electrodes 26 does not change even if they are not electrically connected with the second electrode 22.

The buried bodies 31 divide respective ones of the p-type anode layer 13, the n-type semiconductor layer 24 and the p-type semiconductor layer 23 in the second direction X. The n-type semiconductor layer 24 intersects perpendicularly with the first direction Y along which the buried bodies 31 extend.

As shown in FIGS. 7A and 7B, the second electrode 22 is provided on the n-type semiconductor layer 24, the p-type semiconductor layer 23 and the buried bodies 31. The n-type semiconductor layer 24 and the p-type semiconductor layer 23 make ohmic contacts with the second electrode 22.

A peak value of an n-type impurity concentration of the n-type semiconductor layer 24 is higher than a peak value of the n-type impurity concentration of the n-type base layer 12. A peak value of a p-type impurity concentration of the p-type semiconductor layer 23 is higher than a peak value of the p-type impurity concentration of the p-type anode layer 13.

In order to suppress injection of holes to the n-type base layer 12 in a conducted state and increase switching speed, the impurity concentration (net concentration) of the p-type anode layer 13 is for example desirably set to $1 \times 10^{13}$ (cm$^{-2}$) or less.

The n-type semiconductor layer 24 having the n-type impurity concentration higher than the n-type base layer 12 discharges electrons that have been injected from the n-type cathode layer 11 in an ON state to the second electrode 22 without accumulating the electrons. Due to this, the accumulation of the electrons in the n-type base layer 12 can be suppressed, and the switching speed can be made faster.

Further, the n-type semiconductor layer 24 extends in the second direction X that intersects (perpendicularly) with the first direction Y along which the buried bodies 31 extend, and at the same time is contiguous to the p-type semiconductor layer 23. The n-type semiconductor layer 24 is formed continuously in the second direction X between the buried body 31 and the buried body 31. Due to this, the electrons injected from the n-type cathode layer 11 in the ON state can surely be discharged to the second electrode 22 without accumulating the electrons.

As an comparative example, in order to form an n-type semiconductor layer 24 to extend parallel to a first direction Y along which buried bodies 31 extend, a microscopic trench interval of about a few pm or less is required, and such will give rise to an increase in a process difficulty.

Further, a turnoff current flows into the second electrode 22 via the p-type semiconductor layer 23. Under the n-type semiconductor layer 24, the turnoff current flows in the p-type anode layer 13 toward a p-type semiconductor layer 23 side. Due to this, an operation of a parasitic npn transistor including the n-type semiconductor layer 24, the p-type anode layer 13, and the n-type cathode layer 11 can be suppressed. The suppression of the operation of the parasitic npn transistor suppresses a decrease in a breakdown voltage. Note that, aside from making the peak value of the n-type impurity concentration of the n-type semiconductor layer 24 to be at substantially the same degree as the peak value of the p-type impurity concentration of the p-type anode layer 13, or so long as the peak value of the n-type impurity concentration of the n-type semiconductor layer 24 is at or less than 10 times the peak value of the p-type impurity concentration of the p-type anode layer 13, as similar to the first embodiment, it has been confirmed by simulation that the effect of suppressing the operation of the parasitic npn transistor can further be increased.

Figure 8:
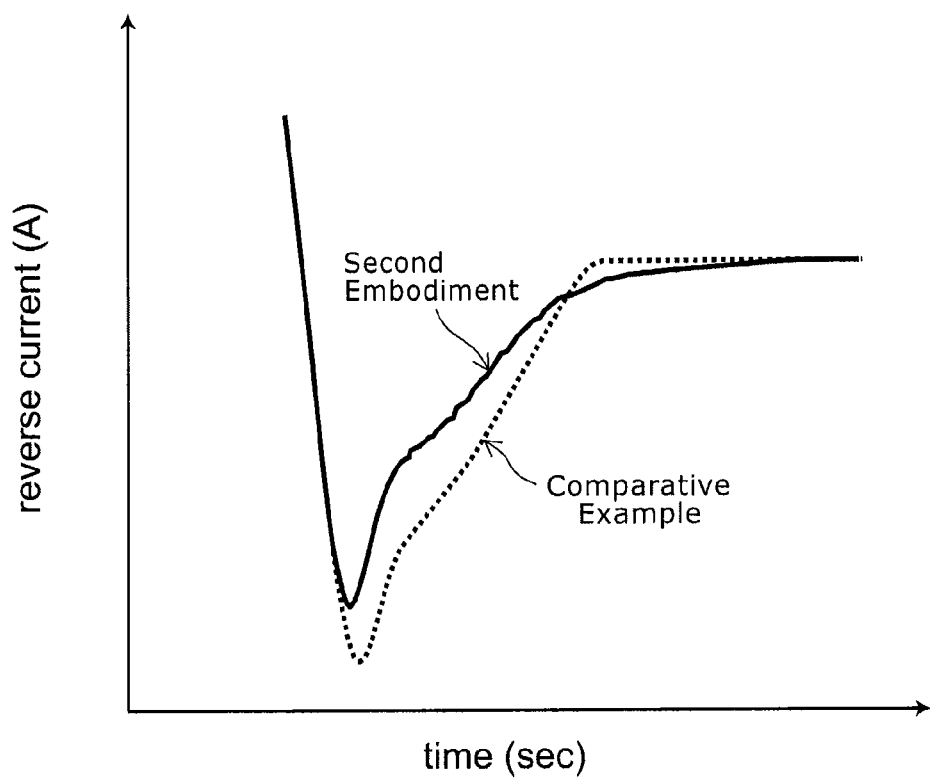
FIG. 8 is a switching wave form chart of the second embodiment and a comparative example.

Here, FIG. 8 is a simulated switching wave form chart of the second embodiment and the above-described comparative example shown in FIG. 13. A horizontal axis indicates time, and a vertical axis indicates a reverse current (A).

In the second embodiment and the comparative example, a total electric charge and an impurity concentration of the p-type anode layer 13 are assumed to be identical, and thus the ON voltage is also identical.

In the second embodiment, compared to the comparative example, the maximum reverse current upon switching is small, and further, a change in a tail current is moderate (soft). Due to the change in the tail current being soft, a voltage vibration is suppressed.

Figure 9:
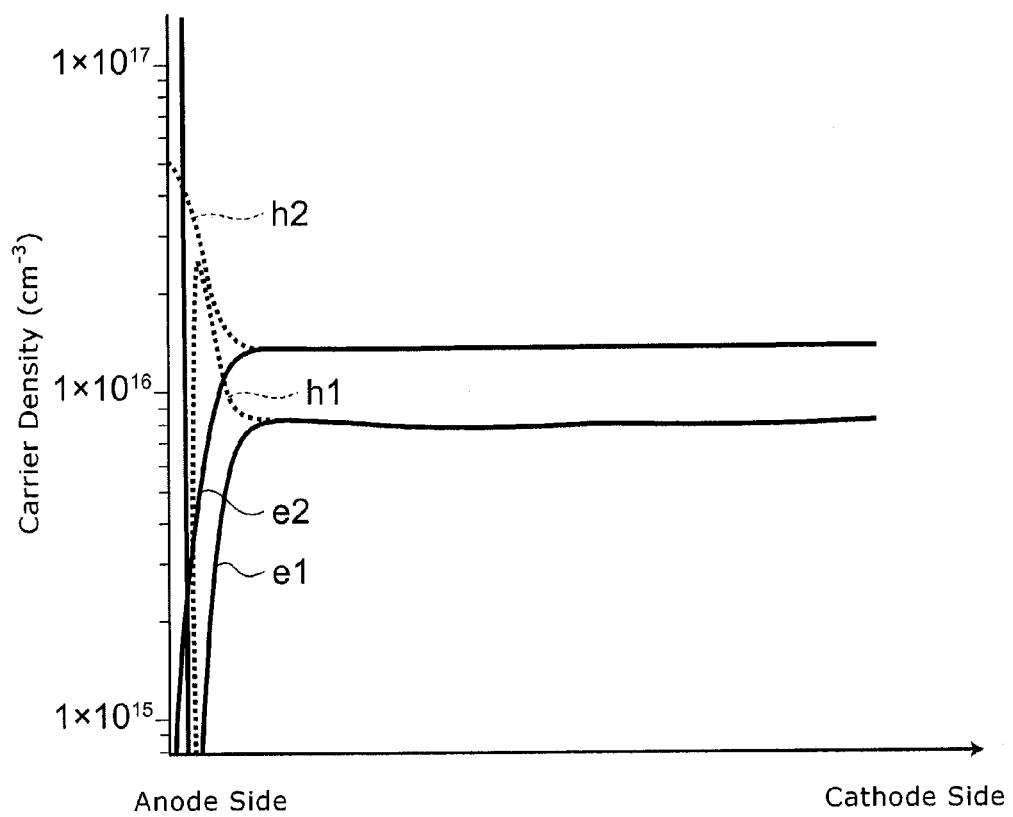
FIG. 9 is a carrier density distribution chart on an anode side in a maximum current conducting state in the second embodiment and the comparative example.

FIG. 9 shows simulation results of a carrier density (cm$^{-3}$) on an anode side in a maximum current conducting state in the second embodiment and the comparative example.

h1 indicates a hole density in the second embodiment, e1 indicates an electron density in the second embodiment, h2 indicates a hole density in the comparative example, and e2 indicates an electron density in the comparative example.

In the second embodiment, it can be understood that the accumulated carriers are reduced compared to the comparative example despite the total electric charge and the impurity concentration of the p-type anode layer 13 being the same as the comparative example. Accordingly, in the second embodiment, the switching speed can be made faster than the comparative example.

(Third Embodiment)

Figure 10:
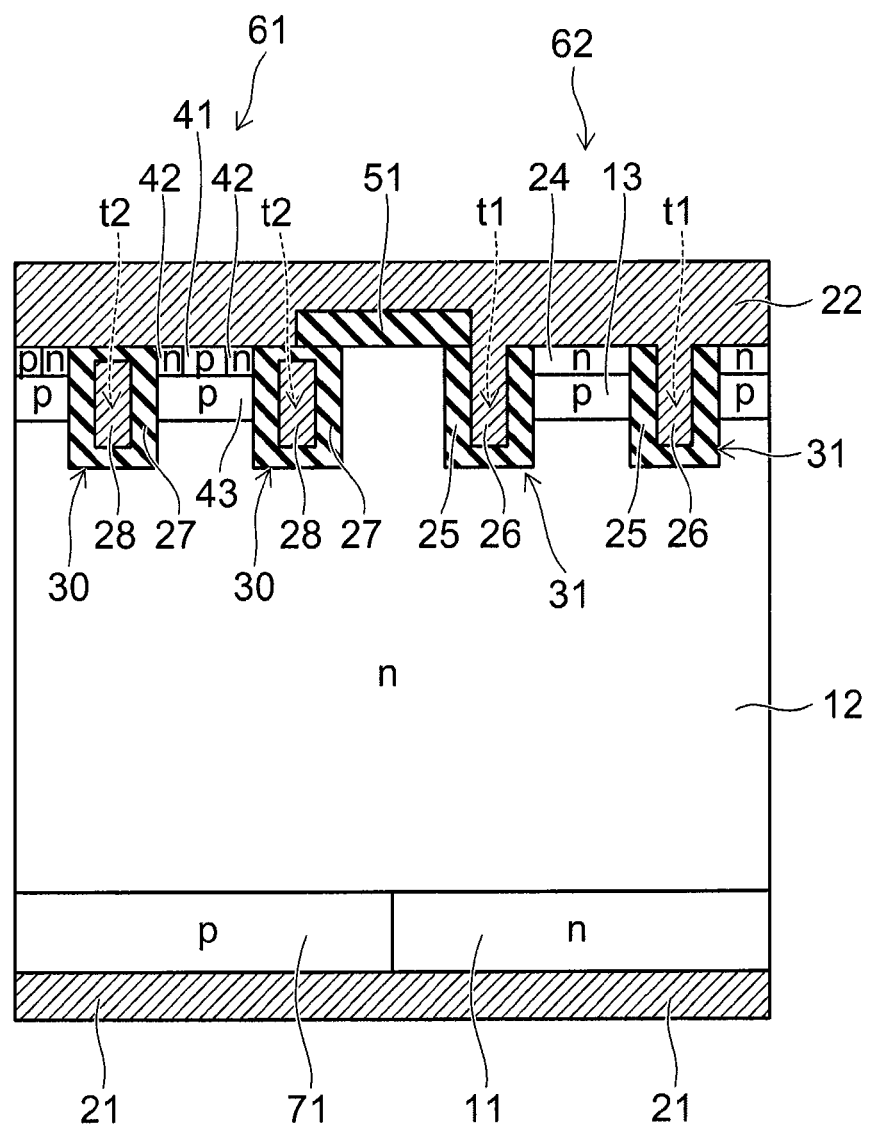
FIG. 10 is a schematic cross sectional view of a semiconductor device of a third embodiment.

FIG. 10 is a schematic cross sectional view of a semiconductor device of the third embodiment.

The semiconductor device of the third embodiment includes a transistor cell 61 and a diode cell 62 provided on a mutual substrate or semiconductor layer.

The transistor cell 61 and the diode cell 62 includes an n-type base layer 12, a first electrode 21, and a second electrode 22 as common components. An insulating film 51 is provided on a surface of the semiconductor layer on a second electrode 22 side between the transistor cell 61 and the diode cell 62.

The transistor cell 61 and the diode cell 62 are both vertical devices in which a main current flows in a vertical direction along which the first electrode 21 and the second electrode 22 are connected. The transistor cell 61 and the diode cell 63 are electrically connected in parallel between the first electrode 21 and the second electrode 22.

The diode cell 62 has an identical structure as the semiconductor device of the second embodiment shown in above-described FIG. 6 and FIGS. 7A, 7B. FIG. 10 corresponds to the cross section of FIG. 7A.

The transistor cell 61 is a vertical Insulated Gate Bipolar Transistor (IGBT) having a trench gate structure for example.

That is, the transistor cell 61 includes a p-type semiconductor layer 71 that functions as a collector layer. The p-type semiconductor layer 71 is provided between the first electrode 21 and the n-type base layer 12.

A p-type base layer 43 is provided on the n-type base layer 12. An n-type semiconductor layer 42 and a p-type semiconductor layer 41 are selectively provided on the p-type base layer 43. The n-type semiconductor layer 42 functions as an emitter layer.

The second electrode 22 is provided on the n-type semiconductor layer 42 and the p-type semiconductor layer 41, and the n-type semiconductor layer 42 and the p-type semiconductor layer 41 make ohmic contacts with the second electrode 22.

Trench gates 30 are provided on a surface side on the second electrode 22 side of the semiconductor stacked body as described above. The trench gates 30 each has a bottom portion making contact with the n-type base layer 12, and a sidewall portion making contact with the n-type base layer 12, the p-type base layer 43, and the n-type semiconductor layer 42.

The trench gates 30 are provided in trenches t2. The trenches t2 penetrate the p-type base layer 43, and reach the n-type base layer 12. Gate insulating films 27 are provided on the bottom portions of the trench gates 30 (bottom walls of the trenches t2) and the sidewall portions of the trench gates 30 (side walls of the trenches t2), respectively. A gate electrode 28 is provided inside each of the gate insulating films 27. The n-type semiconductor layer 42 and the p-type base layer 43 are contiguous to the trench gates 30.

The insulating film 27 is provided on each of the gate electrodes 28, and the gate electrodes 28 are not in contact with the second electrode 22. Parts of the gate electrodes 28 are extended out upward, and are connected with gate interconnections that are not shown.

In a relative respect, when a desired gate voltage is applied to the gate electrodes 28 under a state in which a high potential is applied to the first electrode 21 and a low potential is applied to the second electrode 22, an inversion layer (n-type channel) is formed in the vicinity of interfaces of the p-type base layer 43 with the insulating films 27.

Electrons are injected into the n-type base layer 12 via the n-type channel from the n-type semiconductor layer 42, and the transistor cell 61 comes to be in an ON state. At this occasion, holes are further injected into the n-type base layer 12 from the p-type semiconductor layer 71. In the IGBT, during the ON state, the holes are injected into the n-type base layer 12 from the p-type semiconductor layer 71, whereby a conductivity modulation occurs, and a resistance of the n-type base layer 12 decreases.

The transistor cell 61 and the diode cell 62 are for example connected to an inductive load. The transistor cell 61 functions as a switching device that turns on and off in accordance with a gate potential given to the gate electrodes 28. The diode cell 62 functions as a freewheeling diode that makes a return current due to energy accumulated in the inductive load to flow. Alternatively, the diode cell 62 functions as a protection device that makes a surge current to flow.

According to the embodiment, due to having a structure in which the diode and the IGBT can easily be integrated as one component, the combination that had been configured by different chips can be made into a single chip, and such is advantageous in simplifying a system.

The plurality of trenches t1 of the diode cell 62 and the plurality of trenches t2 of the transistor cell 61 can be formed simultaneously by etching using the same mask.

When a p-type impurity concentration that is appropriate for the p-type base layer 43 of the transistor cell (IGBT) 61 is applied to the p-type anode layer 13 of the diode cell 62, there is a concern in that an injecting amount of the holes injected into the n-type base layer 12 during the conducted state of the diode cell 62 becomes larger than an injecting amount appropriate for the diode cell 62.

On the other hand, when the p-type impurity concentration of the p-type base layer 43 of the transistor cell (IGBT) 61 is adapted to the p-type impurity concentration that is appropriate for the p-type anode layer 13 of the diode cell 62, there is a concern that a threshold voltage for the IGBT to turn on is decreased.

Accordingly, it is desirable to make the p-type impurity concentration of the p-type anode layer 13 of the diode cell 62 lower than the p-type impurity concentration of the p-type base layer 43 of the transistor cell (IGBT) 61.

Figure 11:
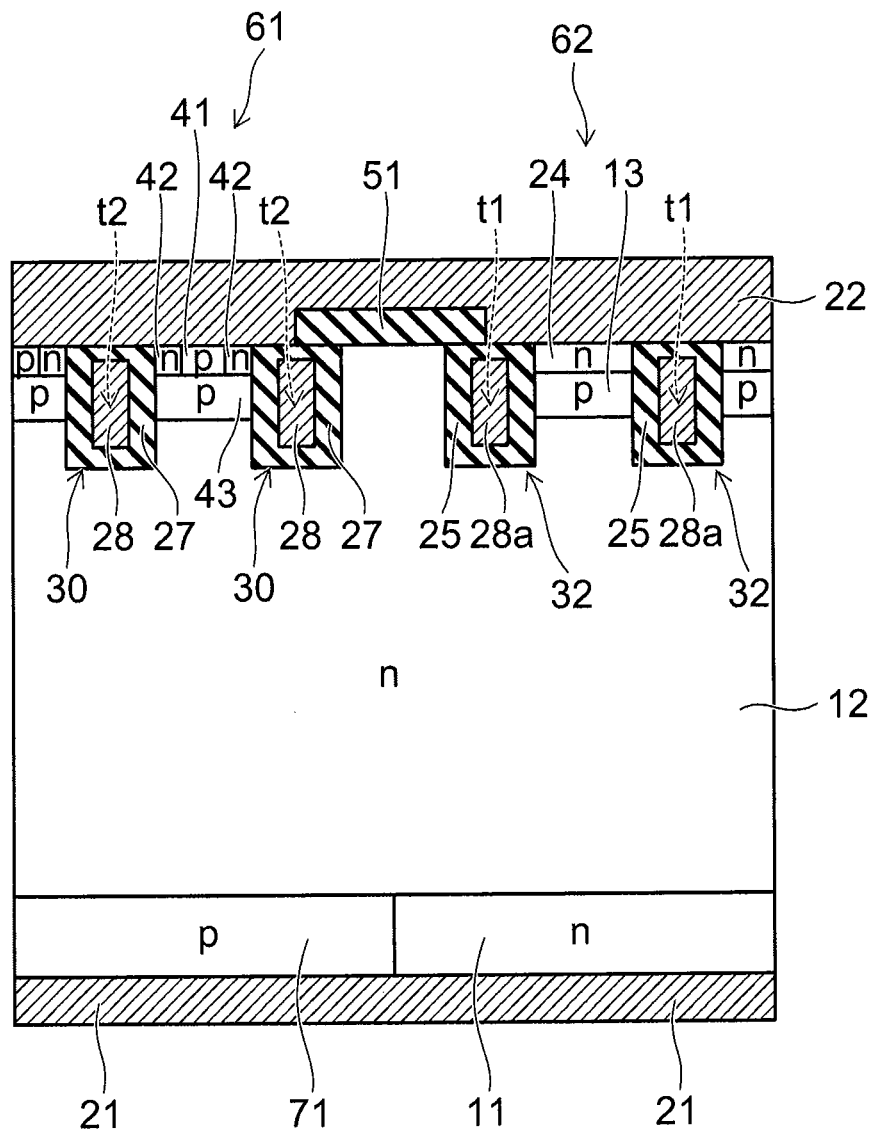
FIG. 11 is a schematic cross sectional view of a first variation of the semiconductor device of the third embodiment.

FIG. 11 is a schematic cross sectional view of a first variation of the semiconductor device of the third embodiment.

A structure shown in FIG. 11 has buried bodies in a diode cell 62 that are different from the structure shown in FIG. 10.

The buried bodies 32 of a diode cell 62 shown in FIG. 11 are provided in trenches t1. Insulating films 25 are provided at bottom portions of the buried bodies 32 (bottom walls of the trenches t1) and sidewall portions (side walls of the trenches t1) of the buried bodies 32, respectively. A third electrode 28a is provided inside each of the insulating films 25. The third electrodes 28a are formed simultaneous with gate electrodes 28 of a transistor cell (IGBT) 61, and are electrically connected with those gate electrodes 28.

Figure 12:
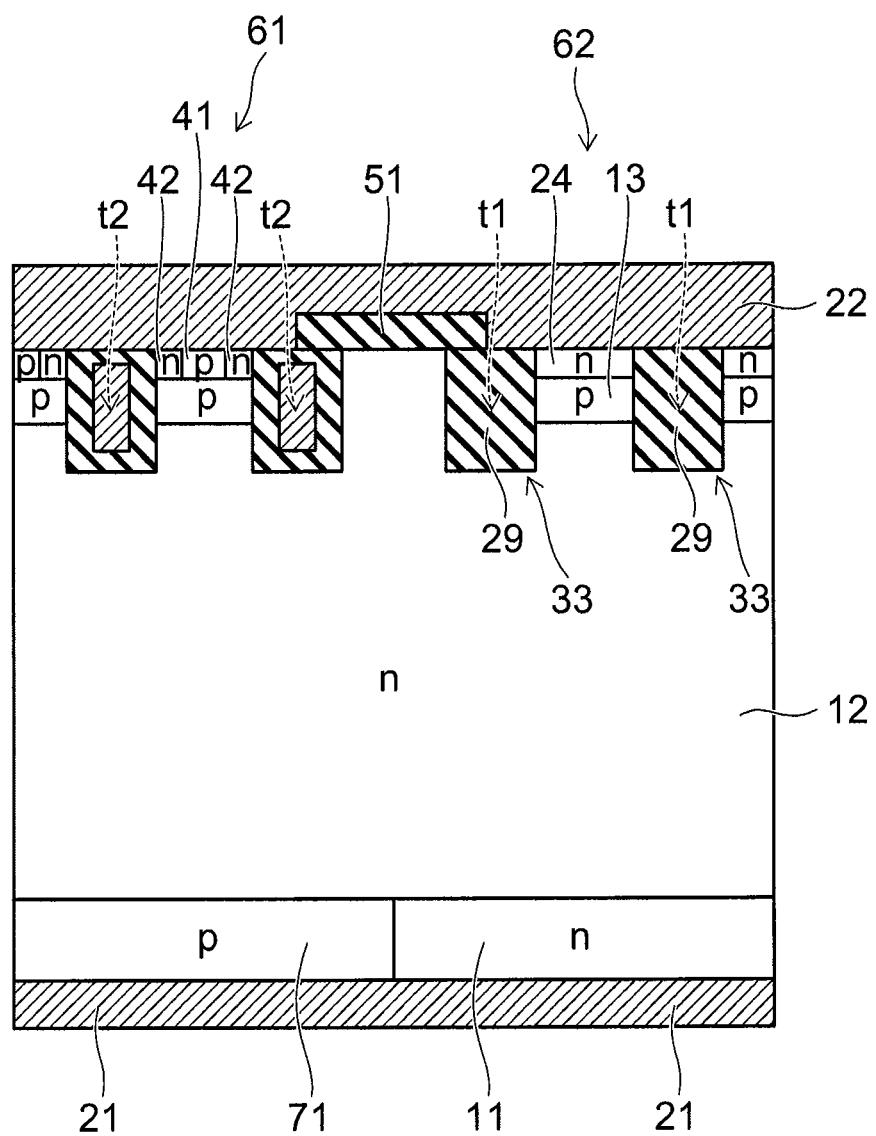
FIG. 12 is a schematic cross sectional view of a second variation of the semiconductor device of the third embodiment.

FIG. 12 is a schematic cross sectional view of a second variation of the semiconductor device of the third embodiment.

A structure shown in FIG. 12 also has buried bodies in a diode cell 62 that are different from the structure shown in FIG. 10.

The buried bodies 33 of the diode cell 62 shown in FIG. 12 are insulators 29 buried in trenches t1. No electrode is provided in the trenches t1, and the buried bodies 33 consist only of the insulators 29. According to this structure, a gate capacitance can be reduced.

According to at least one of the above described embodiments, both the increasing of the switching speed and the softening of the recovery in the diode can be managed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first electrode;
   a first conductivity type cathode layer provided on the first electrode;
   a first conductivity type base layer provided on the first conductivity type cathode layer;

a second conductivity type anode layer provided on the first conductivity type base layer;
a second conductivity type semiconductor layer provided on the second conductivity type anode layer;
a first conductivity type semiconductor layer provided on the second conductivity type anode layer, being contiguous to the second conductivity type semiconductor layer in a first direction, and extending on a surface of the second conductivity type anode layer in a second direction that intersects perpendicularly to the first direction;
a buried body extending in the first direction and including a bottom portion and a sidewall portion, the bottom portion being in contact with the first conductivity type base layer, the sidewall portion being in contact with the first conductivity type base layer, the second conductivity type anode layer, the second conductivity type semiconductor layer and the first conductivity type semiconductor layer; and
a second electrode provided on the first conductivity type semiconductor layer and the second conductivity type semiconductor layer.

2. The device according to claim 1, wherein a peak value of an impurity concentration of the first conductivity type semiconductor layer is at or less than 10 times a peak value of an impurity concentration of the second conductivity type anode layer.

3. The device according to claim 1, wherein a peak value of an impurity concentration of the first conductivity type semiconductor layer is higher than a peak value of an impurity concentration of the first conductivity type base layer.

4. The device according to claim 1, wherein a peak value of an impurity concentration of the second conductivity type semiconductor layer is higher than a peak value of an impurity concentration of the second conductivity type anode layer.

5. The device according to claim 1, wherein the buried body divides each of the second conductivity type anode layer, the second conductivity type semiconductor layer and the first conductivity type semiconductor layer in the second direction.

6. The device according to claim 1, wherein the buried body includes:
an insulating film provided at the bottom portion and the sidewall portion, and a third electrode in a trench containing the insulating film.

7. The device according to claim 6, wherein the third electrode is connected to the second electrode.

8. The device according to claim 7, wherein the second electrode and the third electrode are formed integrally of a same material.

9. The device according to claim 1, wherein the buried body is an insulator.

10. The device according to claim 1, further comprising a transistor cell that includes:
a second conductivity type collector layer provided on the first electrode;
the first conductivity type base layer provided on the second conductivity type collector layer;
a second conductivity type base layer provided on the first conductivity type base layer;
an emitter layer provided on the second conductivity type base layer;
the second electrode provided on the emitter layer;
a gate insulating film extending in the first direction, and being in contact with the base layer, the second conductivity type base layer and the emitter layer; and
a gate electrode in a gate trench containing the gate insulating film and extending in the first direction.

11. The device according to claim 10, wherein an impurity concentration of the second conductivity type anode layer is lower than an impurity concentration of the second conductivity type base layer of the transistor cell.

12. The device according to claim 10, wherein the buried body includes:
an insulating film provided on the bottom portion and the sidewall portion, and
a third electrode in a trench containing the insulating film, the third electrode connected to the gate electrode.

13. A semiconductor device comprising:
a first electrode;
a first conductivity type cathode layer provided on the first electrode;
a first conductivity type base layer provided on the first conductivity type cathode layer;
a second conductivity type anode layer provided on the first conductivity type base layer;
a first conductivity type semiconductor layer provided on the second conductivity type anode layer, and having a peak value of an impurity concentration at or less than ten times a peak value of an impurity concentration of the second conductivity type anode layer; and
a second electrode provided on the first conductivity type semiconductor layer,
the impurity concentration of the first conductivity type semiconductor layer is at the peak value near an interface between the first conductivity type semiconductor layer and the second electrode and is continuously decreasing from the peak value along points of the first conductivity type semiconductor layer that extend from near the interface to the anode layer.

14. A semiconductor device, comprising:
a first electrode;
a first conductivity type cathode layer provided on the first electrode;
a first conductivity type base layer provided on the first conductivity type cathode layer;
a second conductivity type anode layer provided on the first conductivity type base layer;
a first conductivity type semiconductor layer provided on the second conductivity type anode layer, and having a peak value of an impurity concentration at or less than ten times a peak value of an impurity concentration of the second conductivity type anode layer; and
a second electrode provided on the first conductivity type semiconductor layer,
wherein the first conductivity type semiconductor layer is provided on an entire surface of the second conductivity type anode layer.

15. The device according to claim 13, wherein
the first conductivity type semiconductor layer is divided into a plurality of sections on the second conductivity type anode layer, and
the second conductivity type anode layer is in contact with the second electrode between the plurality of first conductivity type semiconductor layers.

16. The device according to claim 15, wherein the plurality of first conductivity type semiconductor layers is provided on the second conductivity type anode layer in a striped pattern.

17. The device according to claim 15, wherein the plurality of first conductivity type semiconductor layers is provided on the second conductivity type anode layer in an island pattern.

* * * * *